United States Patent
Liebig et al.

(10) Patent No.: US 11,733,325 B2
(45) Date of Patent: Aug. 22, 2023

(54) METHOD FOR CONTROLLING AN MR APPARATUS

(71) Applicant: Siemens Healthcare GmbH, Erlangen (DE)

(72) Inventors: Patrick Liebig, Erlangen (DE); Tom Hilbert, Lausanne (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/591,586

(22) Filed: Feb. 2, 2022

(65) Prior Publication Data

US 2022/0244329 A1 Aug. 4, 2022

(30) Foreign Application Priority Data

Feb. 3, 2021 (DE) .................... 10 2021 200 990.5

(51) Int. Cl.
*G01R 33/24* (2006.01)
*G01R 33/58* (2006.01)
*G01R 33/54* (2006.01)

(52) U.S. Cl.
CPC .......... *G01R 33/24* (2013.01); *G01R 33/543* (2013.01); *G01R 33/58* (2013.01)

(58) Field of Classification Search
None
See application file for complete search history.

(56) References Cited

U.S. PATENT DOCUMENTS

| | | |
|---|---|---|
| 2012/0256626 A1 | 10/2012 | Adalsteinsson et al. |
| 2013/0300414 A1 | 11/2013 | Guerin et al. |
| 2015/0309147 A1 | 10/2015 | Schmitter et al. |
| 2018/0231622 A1* | 8/2018 | Hetz ..................... A61B 5/055 |
| 2018/0252788 A1 | 9/2018 | Boulant |

FOREIGN PATENT DOCUMENTS

| | | |
|---|---|---|
| WO | 2013169368 A1 | 11/2013 |
| WO | 2017060142 A1 | 4/2017 |

OTHER PUBLICATIONS

Allen D. Elster, Questions and Answers in MRI, , "Flip (or Tip) Angle", URL: http://mriquestions.com/what-is-flip-angle.html (retrieved Feb. 2, 2022) pp. 1-1.
(Continued)

*Primary Examiner* — Rodney E Fuller
(74) *Attorney, Agent, or Firm* — Lempia Summerfield Katz LLC (57) ABSTRACT

In a method for control, input magnetic field map data is received. In this case, the input magnetic field map data for at least one magnetic field type in each case describes a magnetic field map for a state that an examination object is in at an initial location in the MR apparatus. In this case, the estimated magnetic field map data for at least one magnetic field type in each case describes at least one magnetic field map for in each case a state that the examination object is in at an alternative location that is different compared to the initial location. Control data is determined by the system control unit, using the estimated magnetic field map data or using the input magnetic field map data and the estimated magnetic field map data. The control data is suitable for controlling the MR apparatus.

19 Claims, 6 Drawing Sheets

(56) References Cited

OTHER PUBLICATIONS

Boegle, Rainer, Julian Maclaren, and Maxim Zaitsev. "Combining prospective motion correction and distortion correction for EPI: towards a comprehensive correction of motion and susceptibility-induced artifacts." Magnetic Resonance Materials in Physics, Biology and Medicine 23.4 (2010): 263-273.

Boulant, N., M. A. Cloos, and A. Amadon. "B1 and B0 inhomogeneity mitigation in the human brain at 7 T with selective pulses by using average Hamiltonian theory." Magnetic resonance in medicine 65.3 (2011): 680-691.

* cited by examiner

METHOD FOR CONTROLLING AN MR APPARATUS

This application claims the benefit of German Patent Application No. DE 10 2021 200 990.5, filed on Feb. 3, 2021, which is hereby incorporated by reference in its entirety.

BACKGROUND

The present embodiments relate to a method for controlling a magnetic resonance (MR) apparatus, a method for determining a trained function, and an MR apparatus.

In medical engineering, imaging using magnetic resonance (MR) (e.g., magnetic resonance imaging (MRI)) is characterized by high soft tissue contrasts. Here, an examination object (e.g., a human or animal patient) is positioned in an examination space of an MR apparatus. During an MR scan, radio-frequency (RF) transmit pulses are beamed into the examination object, normally with the aid of a transmit coil arrangement of the MR apparatus. Further, gradient pulses are output with the aid of a gradient coil unit of the MR apparatus. As a result of this, temporary magnetic field gradients are generated in the examination space. Thanks to the pulses generated, position-encoded MR signals are excited and triggered in the patient. The MR signals are received by the MR apparatus and are used for the reconstruction of MR images.

Thanks to an RF transmit pulse, a magnetic alternating field, known as a B1 field, is generated in a field of view (FOV) or in an examination space in which the part of the examination object of which an MR image is to be created is situated. This is to be distinguished from a static main magnetic field, also referred to as a B0 field.

In order to achieve a high quality of the MR images, it is advantageous to generate a B1 field that is as spatially homogeneous as possible. Otherwise, because of the short wavelength, this may result in image artifacts, especially in the case of MR apparatuses with a relatively high field strength (e.g., 3 tesla or more). Particularly in systems that permit a parallel transmit (pTx) with multiple transmit coils, one of the ways of increasing the homogeneity of the B1 field is by the use of a suitable RF transmit pulse, which is generated by the multiple transmit coils (e.g., coil elements). The RF transmit pulse and/or gradient pulse needed for generating a homogeneous B1 field also depends on the location of the examination object in the MR apparatus, such that the homogeneity may deteriorate as a result of a movement of the examination object during the MR examination.

SUMMARY AND DESCRIPTION

The scope of the present invention is defined solely by the appended claims and is not affected to any degree by the statements within this summary.

The present embodiments may obviate one or more of the drawbacks or limitations in the related art. For example, control data for a magnetic resonance (MR) excitation of an examination object, where the control data is adjusted to a location of the examination object, may be determined more robustly with respect to movements of the examination object.

The following method for determining control data for the MR excitation of an examination object using an MR apparatus is provided. Input magnetic field map data is received (e.g., by a first interface). In this case, the input magnetic field map data for at least one magnetic field type in each case describes a magnetic field map for a state (e.g., an actual state) that an examination object is in (e.g., actually in) at an initial location (e.g., actual initial location; partially or fully in the MR apparatus). In this case, the estimated magnetic field map data for at least one magnetic field type in each case describes at least one magnetic field map for in each a state (e.g., potential state) that the examination object is (e.g., potentially is) in at an alternative location that is different compared to the initial location. Using the estimated magnetic field map data or using the input magnetic field map data and the estimated magnetic field map data, control data is determined (e.g., by the system control unit). The control data is suitable for controlling an MR excitation of the examination object (e.g., by the MR apparatus). For example, the control data is suitable for controlling at least one RF transmit pulse that may be emitted by a transmit coil arrangement of the MR apparatus and/or for controlling at least one gradient pulse that may be generated by a gradient coil unit of the MR apparatus. The MR excitation may therefore also include the generation of multiple pulse types (e.g., RF transmit pulses and gradient pulses, as well as multiple pulses per pulse type). In this case, the determination of the estimated magnetic field map data and/or the determination of the control data takes place (e.g., by a system control unit) based on an application of a trained function and/or an interpolation function to the input magnetic field map data. For example, it is possible to interpolate individual B1 values (e.g., in the unit "µT/V") and or B0 values (e.g., in the unit "Hz"). The control data may be provided, for example, by a second interface.

Magnetic field maps (e.g., B1 field maps and/or B0 field maps) may be well suited for generating an appropriate MR excitation (e.g., appropriate RF transmit pulses and/or gradient pulses) or the control data thereof. In order to determine the control data, it may be advantageous to know first the background (e.g., the B0 field) and second also the B1 field (e.g., the effects of any individual transmit channels in the field of view; in the homogeneity volume).

Thanks to the determination of the estimated magnetic field map data and/or of the control data based on an application of a trained function and/or an interpolation function to the input magnetic field map data, it is possible to dispense with a time-consuming scan of magnetic field maps. With the aid of the proposed method, it would not, for example, be necessary, in the case of a relatively long MR scan, to keep recording magnetic field maps in the meantime with the aid of the MR apparatus in order to carry out a repeated redetermination of the MR excitation therefrom in order to compensate for any movements of the examination object in the meantime.

For example, scanning precisely one B1 map and/or precisely one B0 map at the initial location of the examination object may be sufficient in order to calculate the associated magnetic field maps for possible other locations of the examination object.

In this case, the at least one magnetic field type may include a B1 field and/or a B0 field. The input magnetic field map data may describe one (e.g., precisely one) B1 field map (e.g., B1 map for short) and/or one (e.g., precisely one) B0 field map (e.g., B0 map for short). Likewise, the estimated magnetic field map data may describe at least one B1 field map (e.g., multiple B1 field maps) and/or at least one B0 field map (e.g., multiple B0 field maps).

The estimated magnetic field map data may describe at least one B1 field map if the input magnetic field map data also describes a B1 field map. The estimated magnetic field map data may describe at least one B0 field map if the input magnetic field map data also describes a B0 field map. The estimated magnetic field map data may therefore describe the same magnetic field types that are also described by the input magnetic field map data.

For example, the input magnetic field map data in each case describes a magnetic field map both for the B1 field and for the B0 field (e.g., the input magnetic field map data describes a B1 field map as well as a B0 field map). For example, each of these field maps describes the respective magnetic field for the same state (e.g., the state that the examination object is in at the initial location in the MR apparatus).

For example, the estimated magnetic field map data describes multiple magnetic field maps both for the B1 field and for the B0 field (e.g., the estimated magnetic field map data describes both multiple B1 field maps and multiple B0 field maps).

For example, the input magnetic field map data and/or the estimated magnetic field map data always describes one or more pairs of field maps consisting of a B1 field map and a B0 field map. Each pair is assigned to precisely one state that the examination object is in at a different location (e.g., in the case of the input magnetic field map data, at the initial location; in the case of the estimated magnetic field map data, at a different alternative location in each case).

The initial location may be an actual initial location. The initial location, for example, represents a real and/or factual initial state, out of which the examination object may move into alternative states.

The alternative location may be a potential alternative location, into which the examination object may potentially move from the initial location. The alternative location may, for example, be a fictitious and/or theoretical and/or possible alternative state, into which the examination object could move (e.g., from the initial state). For example, a determination of the alternative locations is based on assumptions relating to the question of which alternative location the examination object may (e.g., with a certain probability) assume. The alternative locations may be determined such that the probability that the examination object is or could be at the respective alternative location exceeds a predetermined threshold value.

The input magnetic field map data may be scanned data. The estimated magnetic field map data may be estimated and/or calculated and/or non-scanned data.

A location (e.g., an initial location and/or an alternative location) of the examination object may, for example, be determined by a position and/or situation and/or orientation of the examination object. For example, the initial location and/or the alternative location is a location inside the field of view and/or the examination space of the MR apparatus.

The MR excitation may include the generation of at least one RF transmit pulse by a transmit coil arrangement of the MR apparatus and/or of at least one gradient pulse by a gradient coil unit of the MR apparatus.

The control data may describe at least one RF transmit pulse to be emitted by the transmit coil arrangement of the MR apparatus. For example, the control data includes at least one shape and/or one amplitude and/or one phase of the at least one RF transmit pulse. The determination of the control data may include a determination (e.g., a shaping) of the at least one RF transmit pulse to be emitted by the transmit coil arrangement of the MR apparatus (e.g., a calculation of a pulse design).

Further, the control data may describe at least one gradient pulse to be generated by a gradient coil unit of the MR apparatus. For example, the control data includes at least one shape and/or one amplitude and/or one duration of the at least one gradient pulse. The determination of the control data may include a determination (e.g., a shaping) of the at least one gradient pulse to be generated by the gradient coil unit of the MR apparatus (e.g., a calculation of a pulse design).

For example, the determination of the control data may include a redetermination of an RF transmit pulse to be emitted by the transmit coil arrangement of the MR apparatus and/or a rescaling of an RF transmit pulse to be emitted by the transmit coil arrangement of the MR apparatus based on an existing RF transmit pulse. In the case of a rescaling, the shape of the RF pulse normally remains the same, but a corresponding amplitude is adjusted.

The transmit coil arrangement may include multiple transmit coils. The at least one emittable RF transmit pulse may be emitted by a parallel operation of the multiple transmit coils.

For example, the control data for multiple transmit coils of a transmit coil arrangement in each case includes a shape and/or amplitude and/or phase of a partial pulse and/or a time delay between the partial pulses and/or a number of partial pulses. For example, an emittable RF transmit pulse is comprised of multiple partial pulses that differ from one another and in each case may be transmitted by a transmit coil of a multichannel transmit coil arrangement (e.g., the emittable RF transmit pulse is a pTx pulse (for "parallel transmission")). A pTx pulse may also include at least one gradient pulse. This totality of the partial pulses of such a multichannel pulse or of the at least one gradient pulse may, for example, be described by the control data.

Thanks to a pTx pulse, the B1 field thereby generated may be controlled more precisely; such control may, for example, be advantageous in the case of applications with a reduced field of view, shaped saturation bands, or for the reduction of the specific absorption rate (SAR). For example, magnetic field inhomogeneities may be equalized with a pTx pulse (e.g., in the context of "RF shimming") that may be advantageous in the case of, for example, higher field strengths of the main magnetic field of 7 tesla and above.

The at least one shape and/or amplitude and/or phase of the RF transmit pulse or of a partial pulse may, for example, correspond to a shape and/or amplitude and/or phase of a voltage pulse that is applied to the transmit coil arrangement, and/or of a current pulse that flows through the transmit coil arrangement.

The at least one shape and/or amplitude and/or duration of the gradient pulse may, for example, correspond to a shape and/or amplitude and/or duration of a voltage pulse that is applied to the gradient coil unit, and/or of a current pulse that flows through the gradient coil unit.

The estimated magnetic field map data for at least one magnetic field type may describe multiple magnetic field maps for, in each case, a state that the examination object is in at another alternative location in each case.

For example, the estimated magnetic field map data describes a first B1 field map and a second B1 field map as well as a first B0 field map and a second B0 field map. The first B1 field map and the first B0 field map describe a state that the examination object is (or could be) in at a first alternative location, and the second B1 field map and the second B0 field map describe a state that the examination object is (or could be) in at a second alternative location. In this case, the first alternative location and the second alternative location are different. Further, both the alternative locations differ from the initial location. However, it is also, for example, conceivable for the estimated magnetic field map data to describe exclusively B1 field maps or exclusively B0 field maps.

By determining multiple magnetic field maps for different states, the thereby determined magnetic field maps may be used to determine different MR excitations (e.g., of different RF transmit pulses and/or gradient pulses) for different locations. For example, one or more MR excitations may be determined, which, in each case, are suitable for multiple locations (e.g., potential locations) of the examination object.

At least one of the alternative locations may be described by a rotation by, for example, at least 1°, 2°, or 4°, and/or a translation by, for example, at least 1 mm, 2 mm, or 4 mm. The alternative locations may be described by a rotation by up to ±30° and/or a translation by up to ±3 cm from the initial location. Possible movements of the examination object (e.g., of a patient) may be effectively covered with a rotation range or translation range such as this.

The MR excitation of the examination object may take place in an MR scan using the control data. For example, in an MR scan, at least one RF transmit pulse is emitted by the transmit coil arrangement using the control data, and/or at least one gradient pulse is generated by the gradient coil unit. Diagnostic image data may be recorded by the MR scan.

An embodiment of the method for determining data for controlling a transmit coil arrangement of an MR apparatus provides that the input magnetic field map data is recorded in the preliminary MR scan with the aid of the MR apparatus. After the preliminary MR scan, the MR excitation of the examination object takes place in a main MR scan using the control data. For example, at least one RF transmit pulse is emitted by the transmit coil arrangement using the control data, and/or at least one gradient pulse is generated by the gradient coil unit.

The preliminary MR scan may be carried out, for example, in connection with a calibration scan and/or an adjustment scan. Diagnostic image data may be recorded by the main MR scan.

A further embodiment of the method for determining data for controlling a transmit coil arrangement of an MR apparatus provides that the determination of the control data includes an optimization to the effect that the MR excitation is optimized for a location range that includes the alternative locations and/or the initial location. For example, at least one RF transmit pulse that may be emitted by the transmit coil arrangement and/or at least one gradient pulse that may be generated by the gradient coil unit is optimized for a location range that includes the alternative locations and/or the initial location.

A location range may, for example, be established by a particular rotation range and/or a particular translation range.

Thanks to an optimization with respect to a range of possible locations of the patient, an MR excitation may be determined that is especially robust with respect to movements by patients away from the initial location. An MR excitation stemming from such an optimization, for example, represents a compromise, in that the MR excitation does not bring about an optimal B1 field homogeneity specifically for a particular location, but rather a homogeneity that is designed to deteriorate as little as possible even in the case of movements inside the range.

The control data may be suitable for MR excitation in accordance with multiple excitation configurations. The determination of the control data includes an optimization to the effect that each of the multiple excitation configurations includes an MR excitation that is optimized for a different location range of the examination object in each case.

Each excitation configuration may be assigned to one of the different location ranges. An excitation configuration such as this may, for example, include at least one RF transmit pulse and/or at least one gradient pulse.

For example, the control data is suitable for controlling multiple RF transmit pulses that may be emitted by the transmit coil arrangement of the MR apparatus and/or at least one gradient pulse that may be generated by the gradient coil unit of the MR apparatus. The determination of the control data includes an optimization to the effect that the RF transmit pulses and/or gradient pulses are optimized in each case for a different location range of the examination object. For example, thanks to the optimization, multiple RF transmit pulses and/or gradient pulses that generate a highly homogeneous B1 field in a respective optimization range are obtained. As a result, it is, for example, possible to better differentiate between different possible location states than if only a single RF transmit pulse were to be determined for all location states.

The location ranges are, for example, established relative to the initial location. For example, a first location range includes a rotation away from the initial location in a range between 0 and 5°. For example, a second location range includes a rotation away from the initial location in a range between 5 and 10°. For example, a third location range includes a rotation away from the initial location in a range between 10 and 15°, etc.

For example, the initial location of the examination object in the MR apparatus may be determined during the preliminary MR scan, and a current location of the examination object may be determined during the main MR scan. In this case, the current location may be assigned to one of the different location ranges. The MR excitation of the examination object takes place in accordance with the excitation configuration of the assigned location range. For example, at least one RF transmit pulse optimized for the assigned location range is emitted by the transmit coil arrangement and/or at least one gradient pulse by the gradient coil unit.

Depending on how the patient moves, or into which location range he or she moves away from the initial location, a suitable RF transmit pulse and/or gradient pulse may thereby be transmitted.

A further form of embodiment of the method for determining data for controlling a transmit coil arrangement of an MR apparatus provides that the initial location is determined during the preliminary MR scan. A current location of the examination object in the MR apparatus is determined during the main MR scan. At least one alternative location is determined. The determination of the at least one alternative location takes place using the current location.

MR excitations may be determined only for the alternative locations into which the examination object also actually moves. Such MR excitations (e.g., RF transmit pulses and/or gradient pulses) may then be optimized very specifically to the current location of the patient.

The initial location and/or the current location of the examination object may, for example, be determined by a navigator scan, a pilot tone scan, and/or a camera recording. The techniques cited may be configured to detect the examination object (e.g., the location thereof, in whole or in part; within the field of view of the MR scan and/or of the examination space of the MR apparatus).

The navigator scan, for example, includes an MR scanning technique in which additional spin echoes and/or gradient echoes are scanned for the detection of position changes of the examination object.

The pilot tone scan, for example, includes a scanning technique in which radio-frequency pulses not equal to the Lamour frequency are beamed into the examination object and are received by a receive coil arrangement, with which MR signals in accordance with the Lamour frequency are also received.

The camera recording may, for example, be carried out with a camera (e.g., a 3D camera) that is arranged inside or outside a bore of the MR apparatus.

Further, a method for providing a trained function for determining estimated magnetic field map data and/or control data is provided. In this case, training input data is received (e.g., by a first training interface). The training input data includes training input magnetic field map data. The training input magnetic field map data for at least one magnetic field type in each case describes a magnetic field map for a state that an examination object is in at an initial location (e.g., in whole or in part) in the MR apparatus. Training output data is received (e.g., by a second training interface). The training output data includes training estimated magnetic field map data and/or training control data for controlling an MR excitation of the examination object. The training estimated magnetic field map data for at least one magnetic field type in each case describes at least one magnetic field map for in each case a state that the examination object is in at an alternative location that is different compared to the initial location. A trained function is trained based on the training input data and the training output data (e.g., using a training arithmetic unit) and is provided (e.g., by a third training interface).

The training input data and/or the training output data may be generated by a scan and/or simulation of magnetic field maps. The associated movement states (e.g., locations) of the examination object are known for the scanned and/or simulated magnetic field maps.

Further, an MR apparatus that is configured to carry out a method for determining data for controlling a transmit coil arrangement of an MR apparatus is provided.

The advantages of the MR apparatus correspond substantially to the advantages of the method for determining data for controlling a transmit coil arrangement of an MR apparatus, which are explained in detail above. Features, advantages, or alternative forms of embodiment mentioned here may likewise be transferred to the other subject matters and vice versa.

Further, a computer program product that includes a program, may be loaded directly into a memory of a programmable system control unit of an MR apparatus, and has program means (e.g., libraries and auxiliary functions) in order to execute a method of one or more of the present embodiments when the computer program product is executed in the system control unit of the MR apparatus is provided. The computer program product may, in this case, include software with a source code that does not need to be either compiled or linked, or only needs to be interpreted, or may include an executable software code that only has to be loaded into the system control unit for execution.

Thanks to the computer program product, the method of one or more of the present embodiments may be executed quickly, identically reproducibly, and robustly. The computer program product is configured such that the computer program produce may execute the method acts using the system control unit. The system control unit in this case may have, in each case, the prerequisites, such as, for example, a corresponding main memory, a corresponding graphics card, or a corresponding logic unit, such that the respective methods acts may be executed efficiently.

The computer program product is, for example, stored on a computer-readable medium (e.g., a non-transitory computer-readable storage medium) or is kept on a network or server, from where the computer program product may be loaded into the processor of a local system control unit. The processor may be directly connected to the MR apparatus or may be embodied as part of the MR apparatus. Further, control information of the computer program product may be stored on an electronically readable data carrier. The control information on the electronically readable data carrier may be configured such that the control information carries out a method of one or more of the present embodiments when the data carrier is used in a system control unit of an MR apparatus.

Examples of electronically readable data carriers are a DVD, a magnetic tape, or a USB stick, on which electronically readable control information (e.g., software) is stored. When this control information is read from the data carrier and stored in a system control unit of the MR apparatus, all forms of embodiment of the previously described method may be carried out. Thus, the present embodiments may also emanate from the computer-readable medium and/or the electronically readable data carrier.

BRIEF DESCRIPTION OF THE DRAWINGS

Parts corresponding to one another are provided with same reference characters in all figures.

DETAILED DESCRIPTION

Figure 1:
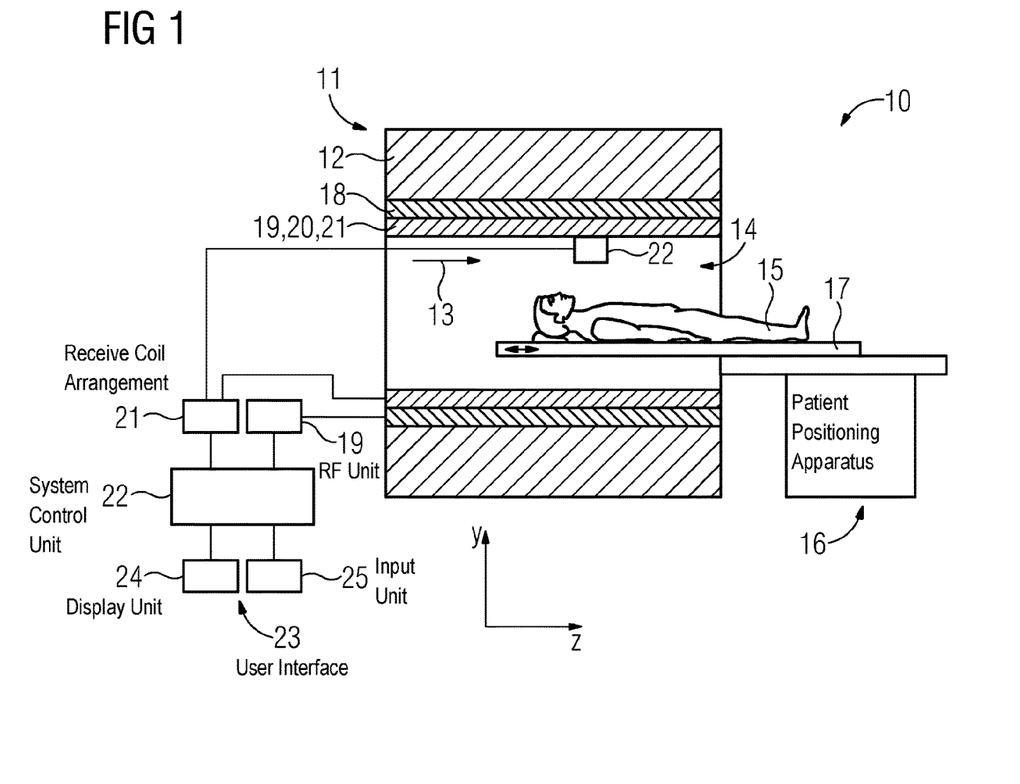
FIG. 1 shows one embodiment of a magnetic resonance (MR) apparatus in a schematic representation.

FIG. 1 schematically represents a magnetic resonance (MR) apparatus 10. The MR apparatus 10 includes a magnetic unit 11 that has a main magnet 12 for generating a static main magnetic field 13. The MR apparatus 10 includes a patient receiving area 14 to receive an examination object 15 (e.g., a patient). The patient receiving area 14 in the present exemplary embodiment is configured to be cylindrical and is cylindrically surrounded in a circumferential direction by the magnetic unit 11. However, in principle, a design of the patient receiving area 14 that deviates from this may be provided. The examination object 15 may be moved into the patient receiving area 14 by a patient positioning apparatus 16 of the MR apparatus 10. The patient positioning apparatus 16 has a patient table 17 that is configured to be movable inside the patient receiving area 14.

The magnetic unit 11 also has a gradient coil unit 18 for generating magnetic field gradient pulses (e.g., gradient pulses). The gradient pulses are, for example, used for position encoding during imaging. The gradient coil unit 18 is controlled by a system control unit 22 of the MR apparatus 10. The magnetic unit 11 also includes a radio-frequency antenna unit 19 that, in the present exemplary embodiment, is configured as a body coil permanently integrated into the MR apparatus 10. The radio-frequency antenna unit 19, for example, includes a transmit coil arrangement 20 for transmitting and beaming radio-frequency RF transmit pulses into an examination space, which is essentially formed by a patient receiving area 14 of the MR apparatus 10. The transmit coil arrangement 20 may include multiple transmit coils (e.g., multiple transmit coil channels that may be operated in parallel; the MR apparatus 10 is pTx-enabled).

In the example represented, the transmit coil arrangement 20 is part of the body coil permanently integrated into the MR apparatus 10. The transmit coil arrangement 20 may, however, also be configured as an apparatus that may be positioned locally on the examination object and that is not permanently integrated into the MR apparatus 10 (e.g., as part of a local coil). In the case of MR apparatuses 10 with a particularly strong main magnetic field 13 of, for example, more than 5 tesla, it may be advantageous to position the transmit coil arrangement 20 very close to the examination object 15.

The radio-frequency antenna unit 19 is controlled by the system control unit 22 of the MR apparatus 10. By RF transmit pulses being beamed by the transmit coil arrangement 20 at the same time as magnetic field gradients are being generated by the gradient coil unit 18, an excitation of atomic nuclei occurs in the main magnetic field 13 generated by the main magnet 12. MR signals are generated thanks to relaxation of the excited atomic nuclei. The radio-frequency antenna unit 19 is also configured to receive the MR signals. The radio-frequency antenna unit 19 includes a receive coil arrangement 21. The receive coil arrangement 21 may be the same as the transmit coil arrangement 20 (e.g., the associated coils are suitable both for transmitting RF pulses and for receiving MR signals). The receive coil arrangement 21 may, however, also be characterized by a separate coil arrangement independent of the transmit coil arrangement 20.

For control of the main magnet 12, of the gradient coil unit 18, and of the radio-frequency antenna unit 19, the MR apparatus 10 has a system control unit 22. The system control unit 22 controls the MR apparatus 10 centrally during an MR scan (e.g., during the performance of an imaging sequence). Moreover, the system control unit 22 includes an evaluation unit (not shown in greater detail) for evaluation of the MR signals that are detected during the MR examination. The MR apparatus 10 further includes a user interface 23 that is connected to the system control unit 22. Control information such as imaging parameters, for example, as well as reconstructed MR images, may be displayed on a display unit 24 (e.g., on at least one monitor) of the user interface 23 for medical operating personnel. Further, the user interface 23 has an input unit 25, by which information and/or parameters may be input by the medical operating personnel during a scanning operation.

Figure 2:
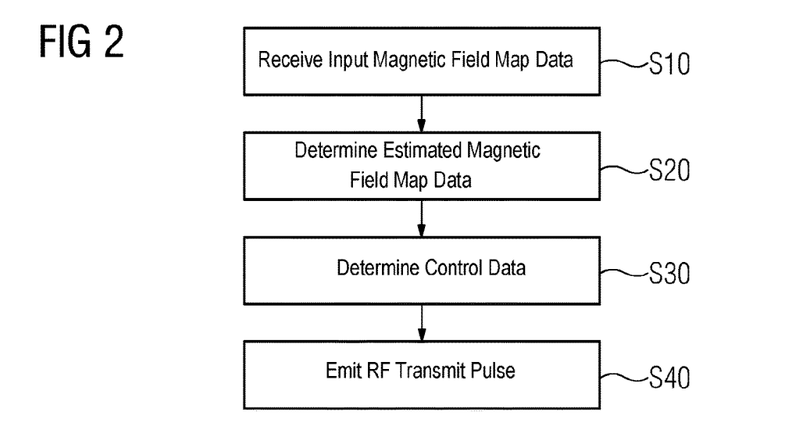
FIG. 2 shows one embodiment of a method for determining data for controlling an MR excitation using the MR apparatus.

Represented in FIG. 2 (in conjunction with FIG. 3) is a method for determining control data for the MR excitation of the examination object 15 by the MR apparatus 10. The MR excitation may, for example, include the generation of at least one RF transmit pulse by the transmit coil arrangement 20 of the MR apparatus 10 and/or of at least one gradient pulse by a gradient coil unit 18 of the MR apparatus 10. In the following explanations, by way of example, only the generation of at least one RF transmit pulse is looked at in detail for the sake of simplicity.

In S10, input magnetic field map data IMD is received. The input magnetic field map data IMD for at least one magnetic field type B0, B1 in each case describes a magnetic field map $B1_{P0}$, $B0_{P0}$ for a state which an examination object 15 is in at an initial location P0 in the MR apparatus 10 (e.g., in the patient receiving area 14).

In S20, estimated magnetic field map data EMD is determined. The estimated magnetic field map data EMD for at least one magnetic field type B0, B1 in each case describes at least one magnetic field map $B1_{P1}$, $B0_{P1}$, $B1_{P2}$, $B0_{P2}$, $B1_{P3}$, $B0_{P3}$, $B1_{P4}$, $B0_{P4}$ for in each case a state that the examination object 15 is in at an alternative location P1, P2, P3, P4 that is different compared to the initial location.

In S30, control data SD is determined using the estimated magnetic field map data EMD or using the input magnetic field map data IMD and the estimated magnetic field map data EMD. The control data SD is suitable for the MR excitation of the examination object 15 (e.g., for controlling at least one RF transmit pulse TxP that may be emitted by the transmit coil arrangement 20 of the MR apparatus 10).

The determination of the estimated magnetic field map data EMD in S20 and/or of the control data in S30 takes place based on an application of a trained function and/or an interpolation function to the input magnetic field map data IMD.

In S40, using the control data SD, at least one RF transmit pulse TxP is emitted by the transmit coil arrangement 20 of the MR apparatus 10. As a result, the at least one RF transmit pulse TxP is beamed into the patient receiving area 14 (e.g., into the examination object 15) for the generation of MR signals.

The at least one magnetic field type may include a B1 field and/or a B0 field, which is represented in FIG. 1 as a main magnetic field 13.

Figure 3:
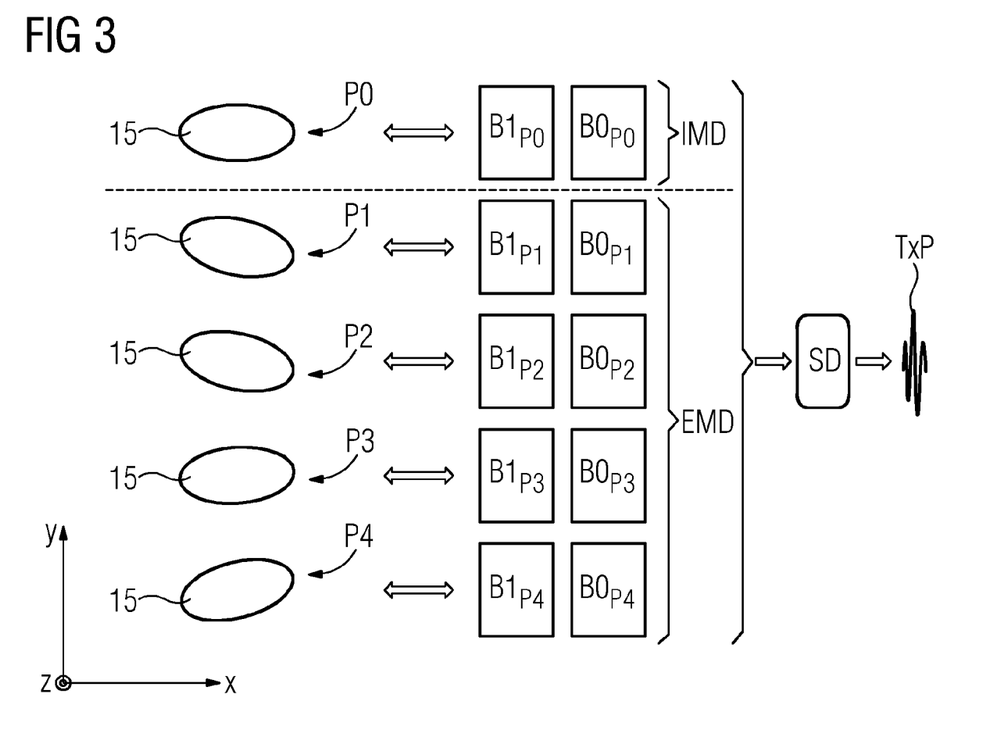
FIG. 3 shows different locations of an examination object with assigned magnetic field maps for generating a transmit pulse.

The estimated magnetic field map data EMD for at least one magnetic field type B0, B1 may describe multiple magnetic field maps $B1_{P1}$, $B0_{P1}$, $B1_{P2}$, $B0_{P2}$, $B1_{P3}$, $B0_{P3}$, $B1_{P4}$, $B0_{P4}$ for in each case a state that the examination object 15 is in at another alternative location P1, P2, P3, P4 in each case.

By way of example, a state is represented in FIG. 3 that the examination object 15 is in at an initial location P0. For this state, input magnetic field map data IMD describes the B1 map $B1_{P0}$ and the B0 map $B0_{P0}$. In FIG. 3, states are represented that the examination object 15 is in at an alternative location P1, P2, P3, P4 that is different compared to the initial location, and that may be described by a rotation (e.g., about the z-axis that is orthogonal to the x-axis and the y-axis): at the alternative location P1, the examination object is rotated by −5° compared to the initial location; at the alternative location P2, the examination object is rotated by −10° compared to the initial location; at the alternative location P3, the examination object is rotated by +5° compared to the initial location; at the alternative location P4, the examination object is rotated by +10° compared to the initial location.

Further, possible alternative locations may be described by a translation or a combination of rotation and translation. A rotation such as this may take place by at least 1°, 2°, or 4°, and a translation such as this may take place by at least 1 mm, 2 mm, or 4 mm.

In accordance with S20, estimated magnetic field map data EMD is determined in this example based on an application of a trained function and/or an interpolation function to the input magnetic field map data IMD. In this case, the estimated magnetic field map data EMD for the B1 field describes the magnetic field map $B1_{P1}$ and for the B0 field describes the magnetic field map $B1_{P0}$ for the state that the examination object 15 is in at the alternative location P1. In this case, the estimated magnetic field map data EMD describes the B1 map $B1_{P1}$ and the B1 map $B1_{P1}$ for the state that the examination object 15 is in at the alternative location P1; further, the estimated magnetic field map data EMD describes the B1 map $B1_{P2}$ and the B1 map $B1_{P2}$ for the state that the examination object 15 is in at the alternative location P2. Further, the estimated magnetic field map data EMD describes the B1 map $B1_{P3}$ and the B1 map $B1_{P3}$ for the state that the examination object 15 is in at the alternative location P3. Further, the estimated magnetic field map data EMD describes the B1 map $B1_{P4}$ and the B1 map $B1_{P4}$ for the state that the examination object 15 is in at the alternative location P4.

In accordance with S30, control data SD is determined using the input magnetic field map data IMD and the estimated magnetic field map data EMD in the example represented in FIG. 3. The control data SD is suitable, for example for controlling the RF transmit pulse TxP that may be emitted during an MR scan by the transmit coil arrangement 20 of the MR apparatus 10 using the control data SD.

For example, the determination of the control data SD includes an optimization to the effect that the RF transmit pulse TxP is optimized for a location range A, B, C that includes the alternative locations and the initial location. In the present example, an RF transmit pulse TxP that is especially robust with respect to movements (e.g., with respect to rotations by ±10° about the z-axis) of the examination object 15 may, as a result, be generated.

Figure 4:
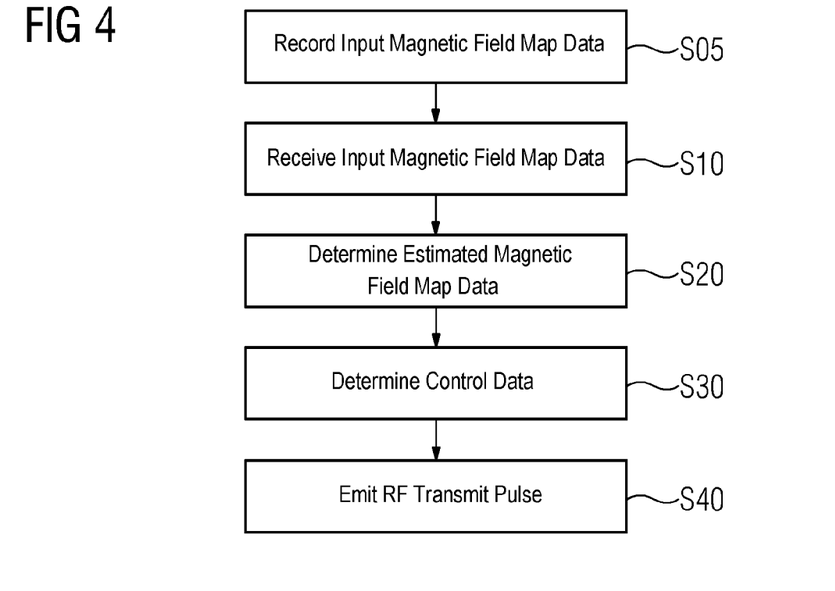
FIG. 4 shows one embodiment of an enhanced method for determining data for controlling a transmit coil arrangement of an MR apparatus.

FIG. 4 (in conjunction with FIG. 5) shows an enhanced method, in accordance with which input magnetic field map data IMD is recorded in S05 in a preliminary MR scan with the aid of the MR apparatus 10. The emission of the at least one RF transmit pulse TxP by the transmit coil arrangement 20 using the control data SD in accordance with S40 takes place in a main MR scan after the preliminary MR scan in S05.

Figure 5:
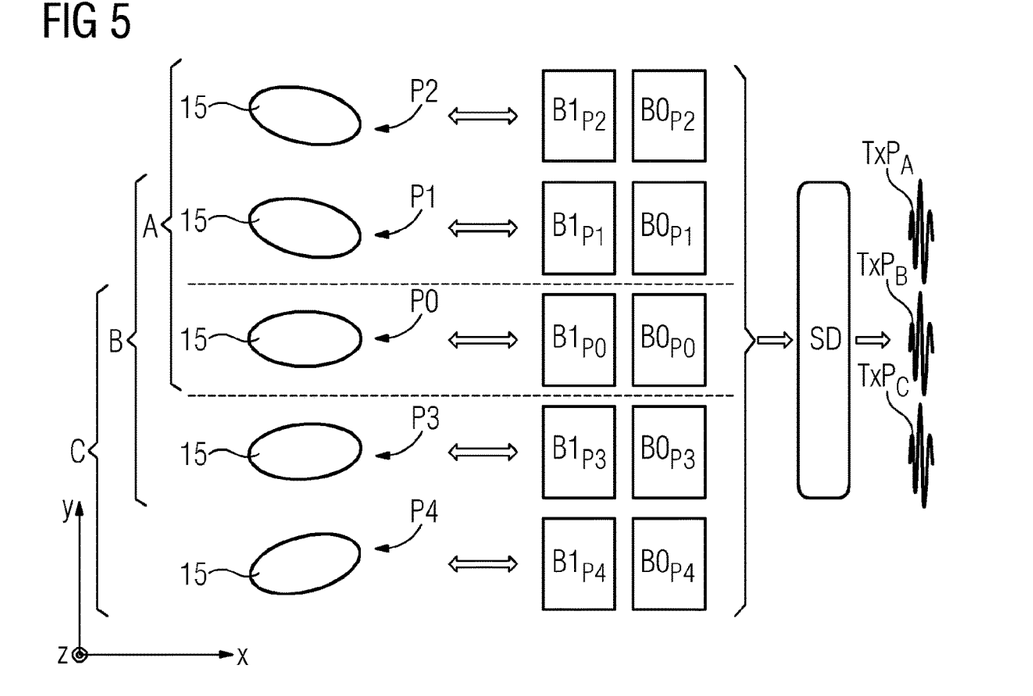
FIG. 5 shows different locations of an examination object with assigned magnetic field maps for generating multiple transmit pulses for different location ranges.

For example, the initial location P0 may be determined in S05 during the preliminary MR scan, and a current location of the examination object 15 in the MR apparatus 10 may be determined in S40 during the main MR scan. Further, in S40, the current location relative to the initial location P0 may be assigned to one of the different location ranges A, B, C, and an RF transmit pulse $TxP_A$, $TxP_B$, $TxP_C$ optimized for the assigned location range A, B, C may be emitted by the transmit coil arrangement 20. The RF transmit pulses $TxP_A$, $TxP_B$, $TxP_C$ in each case represent, for example, a different excitation configuration that, in each case, includes an MR excitation that is optimized in each case for a different location range A, B, C of the examination object 15.

In S30, the determination of the control data SD may include an optimization to the effect that multiple RF transmit pulses $TxP_A$, $TxP_B$, $TxP_C$ that may be emitted by the transmit coil arrangement 20 are optimized for in each case a different location range A, B, C of the examination object, such that the control data SD is suitable for controlling multiple RF transmit pulses $TxP_A$, $TxP_B$, $TxP_C$ that may be emitted by the transmit coil arrangement 20 of the MR apparatus 10. In one embodiment, therefore, not only is an RF transmit pulse TxP calculated in S30, but also multiple ones for a different location range A, B, C in each case.

This will be explained in greater detail by way of example in FIG. 5, for which the same explanations apply as for FIG. 3, unless stipulated otherwise below. In this case, the locations P2, P1, and P0 represent a first location range A that, for example, covers a rotation range from −10° to −3° about the z-axis; the locations P1, P0, and P3 represent a second location range B that, for example, covers a rotation range from −3° to +3° about the z-axis; the locations P0, P3, and P4 represent a third location range C that, for example, covers a rotation range from +3° to +10° about the z-axis. A separate MR excitation (e.g., a separate RF transmit pulse) is optimized for each of these location ranges A, B, C in S30: the RF transmit pulse $TxP_A$ for the location range A, the RF transmit pulse $TxP_B$ for the location range B, and the RF transmit pulse $TxP_C$ for the location range C.

During the MR scan (e.g., during the main scan), it is possible to determine in S40 the actual current location of the examination object 15 at present. This current location may then be assigned to one of the location ranges A, B, C. As a function of this, the RF pulse optimized for this location range may be emitted by the transmit coil arrangement 20. If, for example, the examination object 15 has rotated away from the initial location P0 by +6° about the z-axis, a current location of +6° is determined. This current location falls in the location range C that covers the rotation range from +3° to +10° about the z-axis. Consequently, in S40, the RF transmit pulse $TxP_C$ optimized for this location range C is output.

By subdividing a possible overall location range into smaller location ranges A, B, C, the optimization of the RF pulses may take place more precisely than if the optimization had to take place across the overall location range.

The initial location P0 and/or the current location of the examination object 15 may, for example, be determined by a navigator scan, a pilot tone scan, and/or a camera recording. For example, the MR apparatus 10 may include a camera 26 represented in FIG. 1 in order to carry out the camera recording. For example, the MR apparatus 10 may include a pilot tone transmitter not represented in FIG. 1 in order to carry out the pilot tone scan. In one embodiment, no additional apparatus is necessary for the navigator scan compared to a normal MR apparatus.

Figure 6:
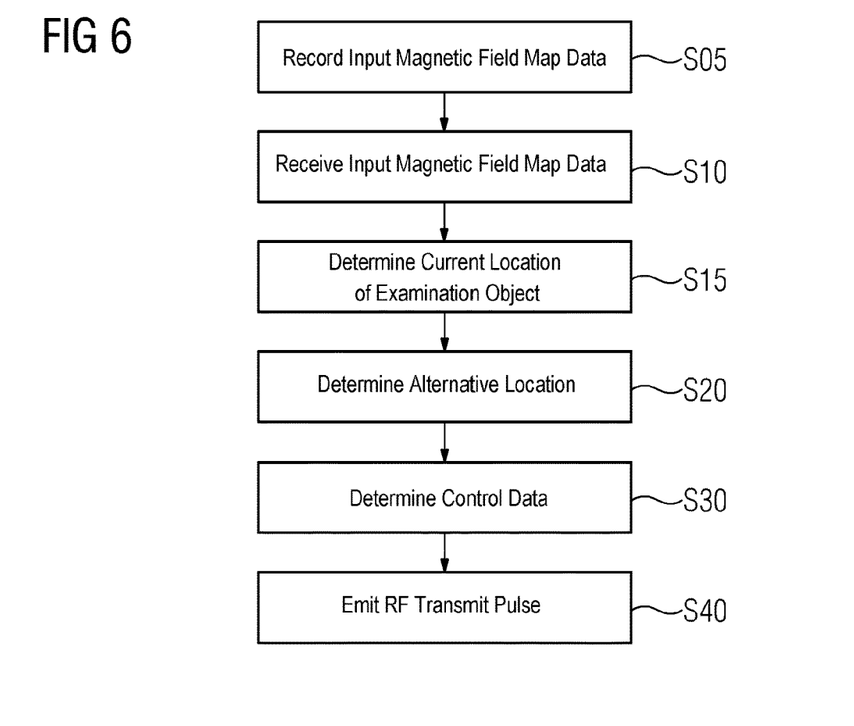
FIG. 6 shows a further embodiment of a method for determining data for controlling a transmit coil arrangement of an MR apparatus.
Figure 7:
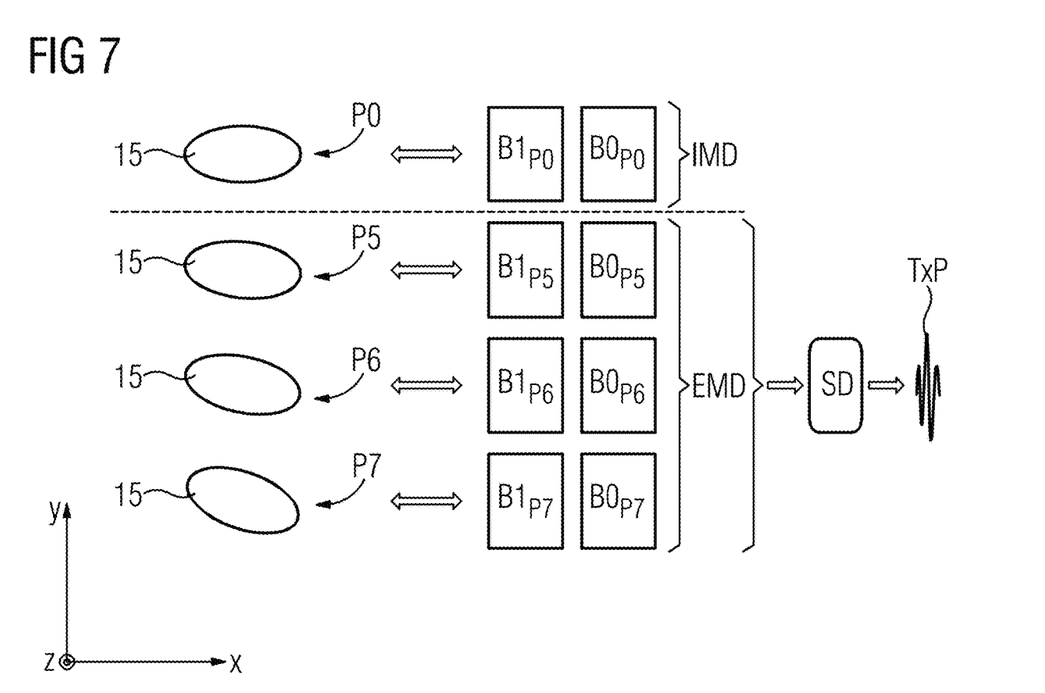
FIG. 7 shows exemplary locations, determined using a current position, of an examination object with assigned magnetic field maps for generating a transmit pulse.

According to a further variant, which is explained using FIGS. 6 and 7, the initial location P0 may be determined in S05 during the preliminary MR scan. In S15, a current location of the examination object 15 in the MR apparatus 10 is determined during the main MR scan, which includes, for example, S15, S20, S30, and S40. The at least one alternative location P5, P6, P7 is then determined in S20 using the current location.

If, for example, a current location is determined that results from a rotation of +9° about the z-axis, an alternative location P6 may then be determined in accordance with which the examination object is rotated by +9° compared to the initial location P0. Further alternative locations P5, P7 around the current location may be determined, such as, for example, an alternative location P5, in accordance with which the examination object is rotated by +6° compared to the initial location P0, and an alternative location P7, in accordance with which the examination object is rotated by +12° compared to the initial location P0. The RF transmit pulse TxP then determined in the further process may be especially robust with respect to rotations of the examination object 15 in a location range from +6° to +12° about the z-axis. However, only one alternative location may, for example, be determined.

Further, in accordance with this variant, estimated magnetic field map data EMD is determined in S20 based on an application of a trained function and/or an interpolation function to the input magnetic field map data IMD. The estimated magnetic field map data EMD in each case describes, for example, a B1 map and a B0 map for the state that the examination object 15 is in at the previously determined alternative locations P5, P6, P7. For example, the estimated magnetic field map data EMD for the B1 field describes the magnetic field map B1ps, and for the B0 field, describes the magnetic field map B1ps for the state that the examination object 15 is in at the alternative location P5. The same applies for P6 and P7.

In accordance with S30, in the example represented in FIG. 7, control data SD is determined using the estimated magnetic field map data EMD. The control data SD is suitable for controlling the RF transmit pulse TxP that may be emitted by the transmit coil arrangement 20 of the MR apparatus 10 using the control data SD during an MR scan. In S40, an RF transmit pulse TxP is emitted by the transmit coil arrangement 20 of the MR apparatus 10 using the control data SD.

In this variant, S15, S20, S30, and S40 may be repeatedly executed during the main MR scan (e.g., the current location is repeatedly redetermined and a corresponding RF transmit pulse TxP (optimized) is determined and emitted).

Figure 8:
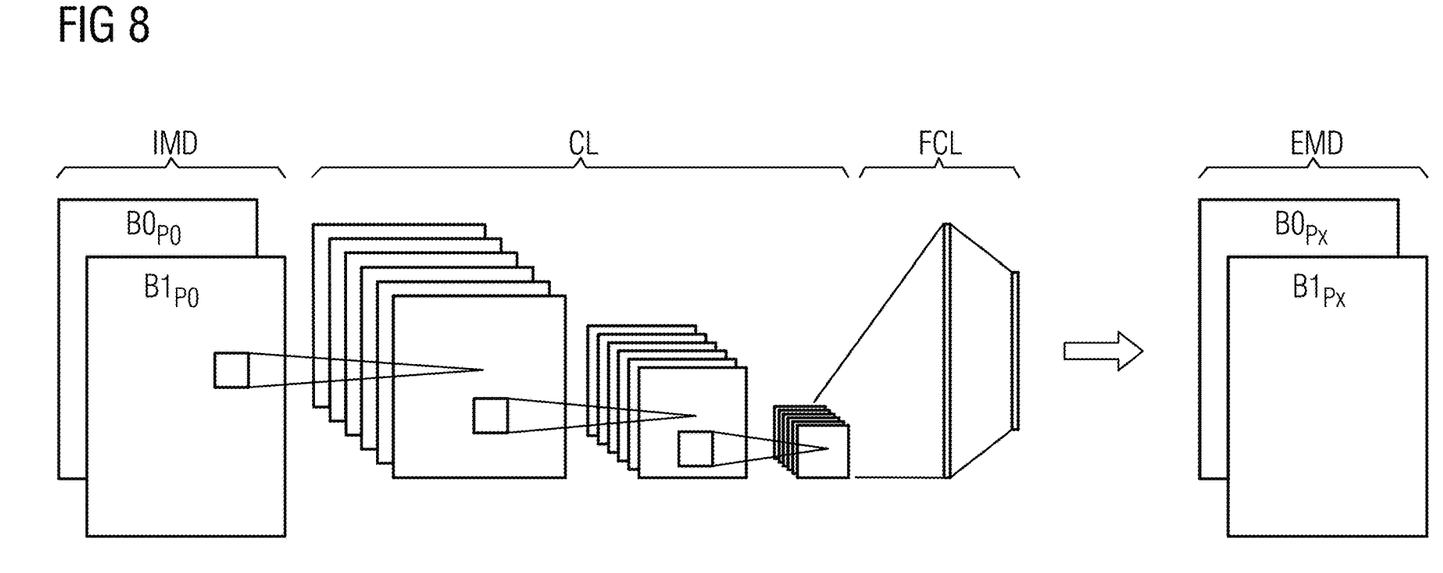
FIG. 8 shows an exemplary trained function for determining estimated magnetic field map data and/or control data.

In FIG. 8, a trained function is represented by way of example. The trained function includes multiple filters in the form of convolutional layers CL and multiple subsequent fully connected convolutional layers. The input data of the trained function is, for example, the input magnetic field map data IMD with the magnetic field maps $B1_{P0}$ and $B0_{P0}$ for the initial location P0. The output data of the trained function is, for example, the estimated magnetic field map data EMD with the magnetic field maps $B1_{Px}$ and $B0_{Px}$ for at least one alternative location Px. In one embodiment, the output data may include the control data SD for controlling an MR excitation of the examination object 15 (e.g., for controlling at least one RF transmit pulse that may be emitted by the transmit coil arrangement 20 of the MR apparatus 10).

Figure 9:
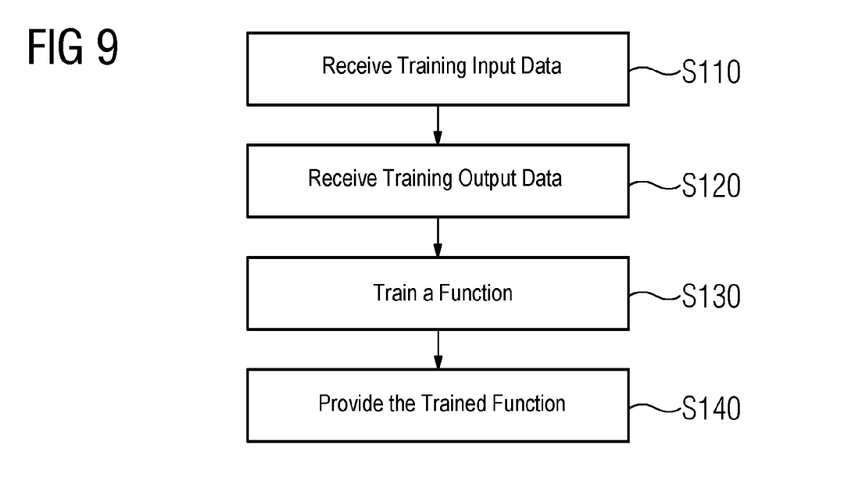
FIG. 9 shows exemplary methods for providing a trained function for determining estimated magnetic field map data and/or control data.

A method for the provision of a trained function for determining estimated magnetic field map data is represented in FIG. 9. In S110, training input data is received. The training input data includes training input magnetic field map data. The training input magnetic field map data for at least one magnetic field type in each case describes a magnetic field map for a state that an examination object 15 is in at an initial location P0 in the MR apparatus 10.

In S120, training output data is received. The training output data includes training estimated magnetic field map data. The training estimated magnetic field map data for at least one magnetic field type in each case describes at least one magnetic field map for a state in each case that the examination object is in at an alternative location Px that is different compared to the initial location P0.

In S130, the trained function is trained based on the training input data and the training output data and is provided in S140.

The training input data and/or the training output data may be generated by scanning and/or simulation of magnetic field maps. A simulation such as this may be very protracted, whereas the application of a trained function is relatively fast. A protracted simulation during the MR scan for determining estimated magnetic field data or for determining control data for an optimized RF transmit pulse is scarcely possible. In one embodiment, a prior generation and provision of a trained function enables the estimated magnetic field data or the control data to be determined during the MR scan.

The method described in detail above and the MR apparatus relate merely to exemplary embodiments that may be modified in various ways by the person skilled in the art without departing from the scope of the invention. Further, the use of the indefinite article "a" or "an" does not rule out that the features in question may also be present multiple times. Likewise, the term "unit" does not rule out that the components in question consist of multiple interworking subcomponents that, where appropriate, may also be spatially distributed.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for determining control data for a magnetic resonance (MR) excitation of an examination object using an MR apparatus, the method comprising:
   receiving input magnetic field map data, wherein the input magnetic field map data for at least one magnetic field type in each case describes a magnetic field map for a state that the examination object is in at an initial location in the MR apparatus;
   determining estimated magnetic field map data, wherein the estimated magnetic field map data for at least one magnetic field type in each case describes at least one magnetic field map for in each case a state that the examination object is in at an alternative location that is different compared to the initial location; and
   determining control data using the estimated magnetic field map data or using the input magnetic field map data and the estimated magnetic field map data,
   wherein the control data is suitable for the MR excitation of the examination object, and
   wherein the determining of the estimated magnetic field map data, the determining of the control data, or the determining of the estimated magnetic field map data and the determining of the control data take place based on an application of a trained function, an interpolation function, or the trained function and the interpolation function to the input magnetic field map data.

2. The method of claim 1, wherein the MR excitation comprises generation of at least one radio frequency (RF) transmit pulse by a transmit coil arrangement of the MR apparatus, generation of at least one gradient pulse by a gradient coil unit of the MR apparatus, or generation of the at least one radio frequency (RF) transmit pulse by the transmit coil arrangement of the MR apparatus and generation of the at least one gradient pulse by the gradient coil unit of the MR apparatus.

3. The method of claim 2, wherein the input magnetic field map data is recorded in a preliminary MR scan with the aid of the MR apparatus, and
wherein after the preliminary MR scan, an MR excitation of the examination object takes place in a main MR scan by the transmit coil arrangement using the control data.

4. The method of claim 3, wherein the control data is suitable for the MR excitation in accordance with multiple excitation configurations, and
wherein determining the control data comprises optimizing to the effect that each of the multiple excitation configurations comprises an MR excitation that is optimized for in each case a different location range of the examination object.

5. The method of claim 4, wherein the initial location is determined during the preliminary MR scan,
wherein a current location of the examination object in the MR apparatus is determined during the main MR scan,
wherein the current location relative to the initial location is assigned to one of the different location ranges, and
wherein the MR excitation of the examination object takes place in accordance with the excitation configuration of the assigned location range.

6. The method of claim 5, wherein the initial location, the current location, or the initial location and the current location of the examination object is determined by a navigator scan, a pilot tone scan, a camera recording, or any combination thereof.

7. The method of claim 3, wherein the initial location is determined during the preliminary MR scan,
wherein a current location of the examination object in the MR apparatus is determined during the main MR scan, and
wherein at least one alternative location is determined using the current location.

8. The method of claim 1, wherein the at least one magnetic field type comprises a B1 field, a B0 field, or the B1 field and the B0 field.

9. The method of claim 1, wherein the estimated magnetic field map data for at least one magnetic field type describes multiple magnetic field maps for in each case a state that the examination object is in at a different alternative location in each case.

10. The method of claim 1, wherein at least one of the alternative locations is describable by a rotation by at least 1°, 2°, or 4°, a translation by at least 1 mm, 2 mm, or 4 mm, or a combination thereof.

11. The method of claim 1, wherein determining the control data comprises optimizing to the effect that the MR excitation is optimized for a location range that comprises the alternative locations, the initial location, or the alternative locations and the initial locations.

12. A method for provision of a trained function for determining estimated magnetic field map data, control data, or the estimated magnetic field map data and the control data, the method comprising:

receiving training input data, wherein the training input data comprises training input magnetic field map data, wherein the training input magnetic field map data for at least one magnetic field type in each case describes a magnetic field map for a state that an examination object is in at an initial location in the MR apparatus;
receiving training output data, wherein the training output data comprises training estimated magnetic field map data, training control data, or the training estimated magnetic field map data and the training control data for controlling an MR excitation of the examination object, wherein the training estimated magnetic field map data for at least one magnetic field type in each case describes at least one magnetic field map for in each case a state that the examination object is in at an alternative location that is different compared to the initial location;
training the trained function based on the training input data and the training output data; and
providing the trained function.

13. The method of claim 12, wherein the training input data, the training output data, or the training input data and the training output data are generated by scanning, simulation, or scanning and simulation of magnetic field maps.

14. A magnetic resonance (MR) apparatus comprising:
a processor configured to determine control data for a magnetic resonance (MR) excitation of an examination object using the MR apparatus, the method determination of the control data comprising:
receipt of input magnetic field map data, wherein the input magnetic field map data for at least one magnetic field type in each case describes a magnetic field map for a state that the examination object is in at an initial location in the MR apparatus;
determination of estimated magnetic field map data, wherein the estimated magnetic field map data for at least one magnetic field type in each case describes at least one magnetic field map for in each case a state that the examination object is in at an alternative location that is different compared to the initial location; and
determination of control data using the estimated magnetic field map data or using the input magnetic field map data and the estimated magnetic field map data,
wherein the control data is suitable for the MR excitation of the examination object, and
wherein the determination of the estimated magnetic field map data, the determination of the control data, or the determination of the estimated magnetic field map data and the determination of the control data take place based on an application of a trained function, an interpolation function, or the trained function and the interpolation function to the input magnetic field map data.

15. In a non-transitory computer-readable storage medium that stores instructions executable by one or more processors to determine control data for a magnetic resonance (MR) excitation of an examination object using an MR apparatus, the instructions comprising:
receiving input magnetic field map data, wherein the input magnetic field map data for at least one magnetic field type in each case describes a magnetic field map for a state that the examination object is in at an initial location in the MR apparatus;
determining estimated magnetic field map data, wherein the estimated magnetic field map data for at least one magnetic field type in each case describes at least one magnetic field map for in each case a state that the examination object is in at an alternative location that is different compared to the initial location; and determining control data using the estimated magnetic field map data or using the input magnetic field map data and the estimated magnetic field map data, wherein the control data is suitable for the MR excitation of the examination object, and wherein the determining of the estimated magnetic field map data, the determining of the control data, or the determining of the estimated magnetic field map data and the determining of the control data take place based on an application of a trained function, an interpolation function, or the trained function and the interpolation function to the input magnetic field map data.

16. The non-transitory computer-readable storage medium of claim 15, wherein the MR excitation comprises generation of at least one radio frequency (RF) transmit pulse by a transmit coil arrangement of the MR apparatus, generation of at least one gradient pulse by a gradient coil unit of the MR apparatus, or generation of the at least one radio frequency (RF) transmit pulse by the transmit coil arrangement of the MR apparatus and generation of the at least one gradient pulse by the gradient coil unit of the MR apparatus.

17. The non-transitory computer-readable storage medium of claim 15, wherein the at least one magnetic field type comprises a B1 field, a B0 field, or the B1 field and the B0 field.

18. The non-transitory computer-readable storage medium of claim 15, wherein the estimated magnetic field map data for at least one magnetic field type describes multiple magnetic field maps for in each case a state that the examination object is in at a different alternative location in each case.

19. The non-transitory computer-readable storage medium of claim 15, wherein at least one of the alternative locations is describable by a rotation by at least 1°, 2°, or 4°, a translation by at least 1 mm, 2 mm, or 4 mm, or a combination thereof.

* * * * *